United States Patent
Arai et al.

(10) Patent No.: US 8,524,103 B2
(45) Date of Patent: Sep. 3, 2013

(54) METHOD FOR MANUFACTURING SUSCEPTOR

(75) Inventors: Hideki Arai, Numazu (JP); Masayoshi Yajima, Kanagawa-ken (JP); Kunihiko Suzuki, Shizuoka-ken (JP)

(73) Assignee: NuFlare Technology, Inc., Shizuoka-ken (JP)

( * ) Notice: Subject to any disclaimer, the term of this patent is extended or adjusted under 35 U.S.C. 154(b) by 476 days.

(21) Appl. No.: 12/635,815

(22) Filed: Dec. 11, 2009

(65) Prior Publication Data
US 2010/0163524 A1    Jul. 1, 2010

(30) Foreign Application Priority Data
Dec. 26, 2008  (JP) .................................. 2008-333544

(51) Int. Cl.
- C23F 1/00 (2006.01)
- C03C 15/00 (2006.01)
- C03C 25/68 (2006.01)
- C25F 3/00 (2006.01)

(52) U.S. Cl.
USPC .............................................. 216/83; 216/99

(58) Field of Classification Search
None
See application file for complete search history.

(56) References Cited

U.S. PATENT DOCUMENTS

| | | | | |
|---|---|---|---|---|
| 4,569,921 A * | 2/1986 | Omori et al. | ..................... | 501/88 |
| 5,514,439 A * | 5/1996 | Sibley | .......................... | 428/64.1 |
| 6,136,243 A * | 10/2000 | Mehregany et al. | .......... | 264/162 |
| 2004/0109748 A1* | 6/2004 | Joe et al. | .................. | 414/416.01 |
| 2004/0169003 A1* | 9/2004 | Lee et al. | .......................... | 216/4 |

FOREIGN PATENT DOCUMENTS
JP  11-67675  3/1999

* cited by examiner

*Primary Examiner* — Nadine Norton
*Assistant Examiner* — Stephanie Duclair
(74) *Attorney, Agent, or Firm* — Finnegan, Henderson, Farabow, Garrett & Dunner, L.L.P.

(57) ABSTRACT

A method for manufacturing a susceptor includes: forming a concave pattern in a surface of a substrate to be processed; applying a SiC paste containing a SiC powder and a sintering agent to the surface of the substrate to be processed to fill the concave pattern to form a SiC coating layer; laminating a SiC substrate on the SiC coating layer; and firing the SiC coating layer to form a SiC layer having at least one convex section on the surface of the SiC substrate.

14 Claims, 4 Drawing Sheets

METHOD FOR MANUFACTURING SUSCEPTOR

CROSS-REFERENCE TO RELATED APPLICATION

This application is based upon and claims the benefit of priority from the prior Japanese Patent Application No. 2008-333544 filed on Dec. 26, 2008, the entire contents of which are incorporated herein by reference.

BACKGROUND OF THE INVENTION

1. Field of the Invention

The present invention relates to a method for manufacturing a susceptor that holds a semiconductor wafer, for example, used in performing film formation on the semiconductor wafer.

2. Description of the Related Art

Generally, a CVD (Chemical Vapor Deposition) apparatus is used in forming an epitaxial film or the like on a wafer in a semiconductor manufacturing process. In such a CVD apparatus, a wafer is placed on a susceptor made of SiC or the like and a uniform process gas is supplied to the wafer from above while the wafer is being heated and rotated to form an epitaxial film on the wafer, as described, for example, in Japanese Patent Application Laid-Open No. 11-67675.

In recent years, with developments for higher speed and higher withstand voltage in a power semiconductor device such as a power MOSFET or IGBT (insulated gate bipolar transistor), an epitaxial film formed on a wafer is required to grow as thick as tens to hundreds of micrometers.

However, when a wafer is heated and a process gas is supplied thereto from above as described above, a coating is also formed on members other than on the wafer, which causes the wafer to be stuck on a susceptor. Then, the wafer fractures and particles are produced therefrom, resulting in low yield and reliability.

Accordingly, for example, embossing a surface of the susceptor may be proposed to prevent a wafer from being stuck on the susceptor. However, it is difficult to prevent the wafer from being stuck on the susceptor by only the embossing work because rough surface portions will be completely buried due to thick film growth as thick as 100 μm. Accordingly, it will be required to form a highly rough surface; however, there is a problem that it is difficult to finely machine a surface of a rigid material such as SiC and further control the shape thereof to be spherical.

SUMMARY

A method for manufacturing a susceptor according to an aspect of the present invention includes: forming a concave pattern in a surface of a substrate to be processed; applying a SiC paste containing a SiC powder and a sintering agent onto the surface of the substrate to be processed to fill the concave pattern to form a SiC coating layer; laminating a SiC substrate on the SiC coating layer; and firing the SiC coating layer to form a SiC layer having convex sections on the surface of the SiC substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWINGS

The accompanying drawing, which are incorporated in and constitute a part of the specification, illustrate embodiments of the invention, and together with the general description given above and the detailed description of the embodiments given below, serve to explain the principles of the invention.

DETAILED DESCRIPTION OF THE EMBODIMENTS

An embodiment according to the present invention will be described below with reference to the accompanying drawings.

Figure 1:
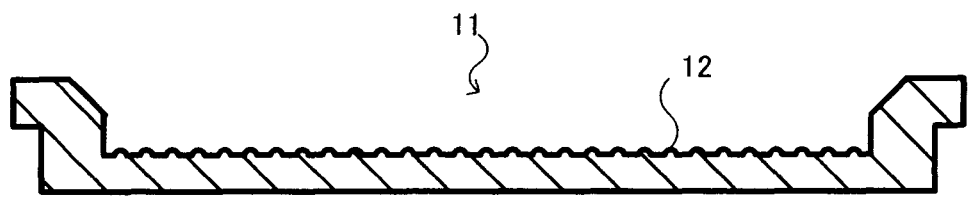
FIG. 1 is a sectional view of a susceptor according to an aspect of the present invention.
Figure 2:
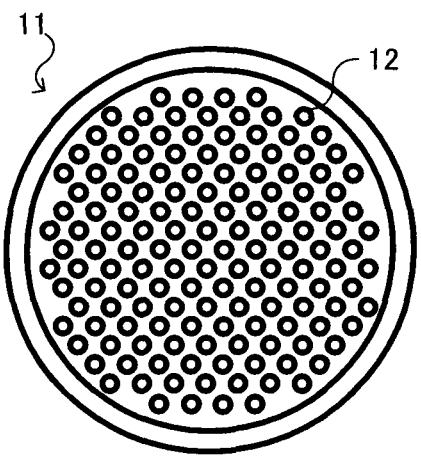
FIG. 2 is a top view of the susceptor according to an aspect of the present invention.
Figure 3:
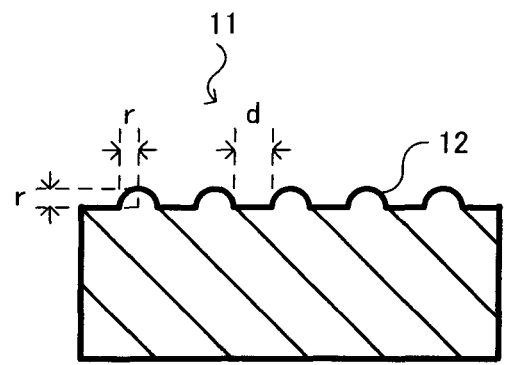
FIG. 3 is an enlarged view of a cross-sectional portion of the susceptor according to an aspect of the present invention.

FIG. 1 illustrates a sectional view of a susceptor formed according to the present embodiment and FIG. 2 illustrates a top view thereof. As illustrated in the figures, convex sections 12 are formed on an entire top face (a wafer placement face) of a susceptor 11 made of SiC. As illustrated in an enlarged view of a cross-sectional portion of the susceptor of FIG. 3, a cross-sectional shape of each of the convex sections is semicircular and a radius r thereof is, for example, 0.5 mm and an interval d between the convex sections is, for example, 1 mm. A SiC coating (not shown) is formed over the entire top face of the susceptor 11 including the convex sections.

Figure 4:
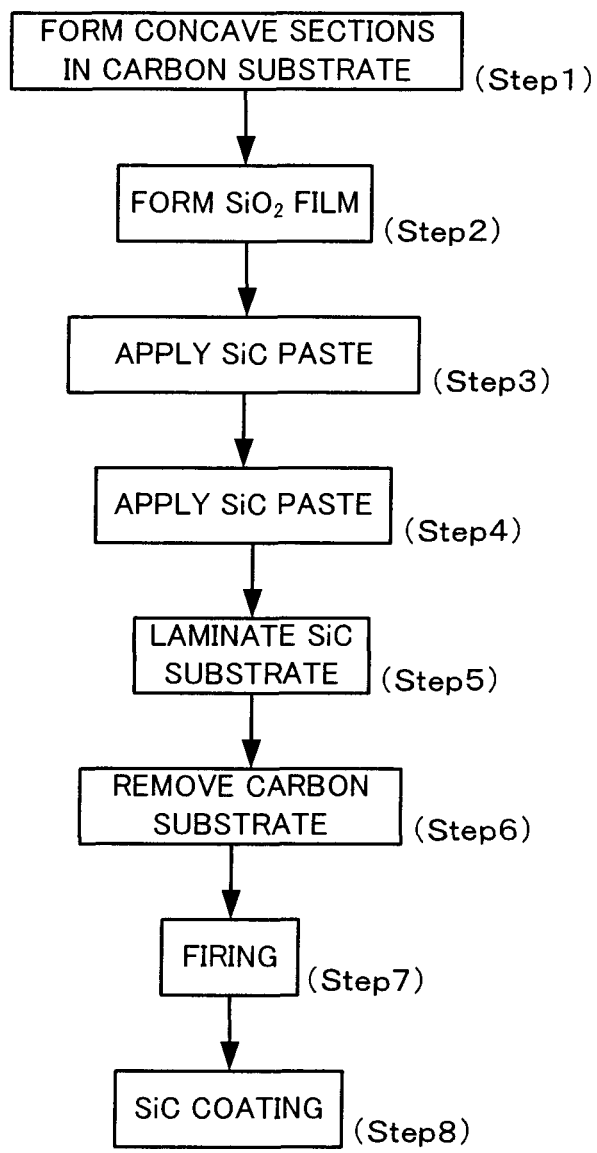
FIG. 4 is a flowchart showing a manufacturing process of the susceptor according to an aspect of the present invention.
Figure 5:
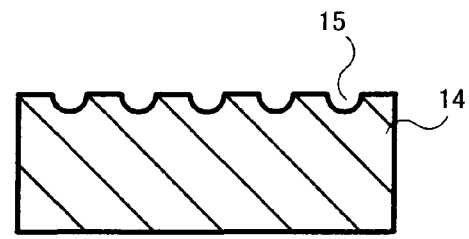
FIGS. 5 to 9 are illustrative views of a manufacturing process of the susceptor according to an aspect of the present invention.
Figure 6:
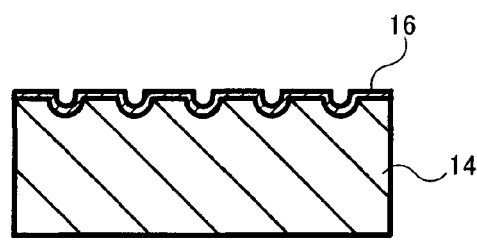

Such a susceptor is formed as shown in a flowchart of FIG. 4. As illustrated in FIG. 5, a plurality of concave sections 15 having a predetermined diameter and depth are formed at predetermined intervals, for example, by mechanical grinding, in a surface of a carbon substrate 14 (Step 1). As illustrated in FIG. 6, a SiO$_2$ film 16 is formed in a thickness of about 0.5 μm over the entire surface of the substrate using, for example, a CVD method (Step 2).

Figure 7:
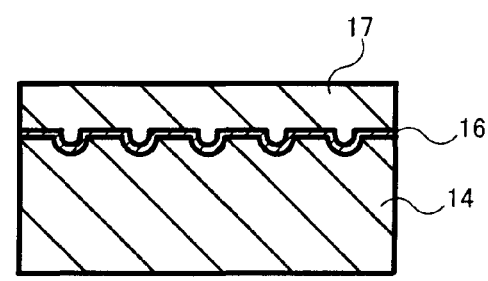

A SiC paste in which a SiC powder, a carbon black and a boron carbide powder as a sintering agent and a binder such as acrylic-based resin or cellulose-based resin are dispersed in, for example, an organic amine-based solvent is prepared. Then, as illustrated in FIG. 7, the SiC paste is applied onto the carbon substrate 14 formed with the SiO$_2$ film 16 in a manner that fill the concave sections are filled (Step 3), thereby forming a SiC coating layer 17.

Figure 8:
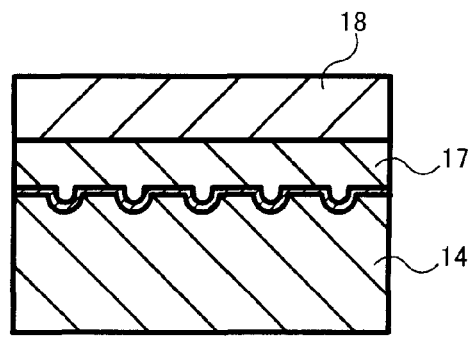

After the SiC coating layer 17 is dried as needed, a SiC substrate 18 is laminated on the SiC coating layer 17 as illustrated in FIG. 8 (Step 4). Subsequently, temporary firing is performed, for example, at 1,400 to 1,500° C. in an inert gas atmosphere or a vacuum to carbonize the binder in the SiC coating layer 17, thereby forming a SiC layer 19 (Step 5).

Figure 9:
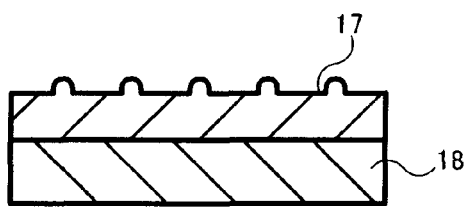

A laminated body of the carbon substrate 14, the SiO$_2$ film 15, the SiC layer 19 and the SiC substrate 18 formed in this way is put into HF solution and the SiO$_2$ film 15 is selectively etched, thereby separating and removing the carbon substrate 14 from the SiC layer 19 and the SiC substrate 18 as illustrated in FIG. 9 (Step 6). The SiC layer 19 and the SiC substrate 18 from which the carbon substrate 14 has been removed are fired in an inert gas atmosphere or a vacuum, for example, at 2,000° C. to sinter the SiC layer, thus forming a sintered SiC layer 20 (Step 7).

A SiC coating is applied on surfaces of the sintered SiC layer 20 and the SiC substrate 18 from which the carbon substrate has been removed by forming a dense CVD-SiC film, for example, using a CVD method (Step 8), thus obtaining the susceptor 11 as illustrated in FIG. 1.

Figure 10:
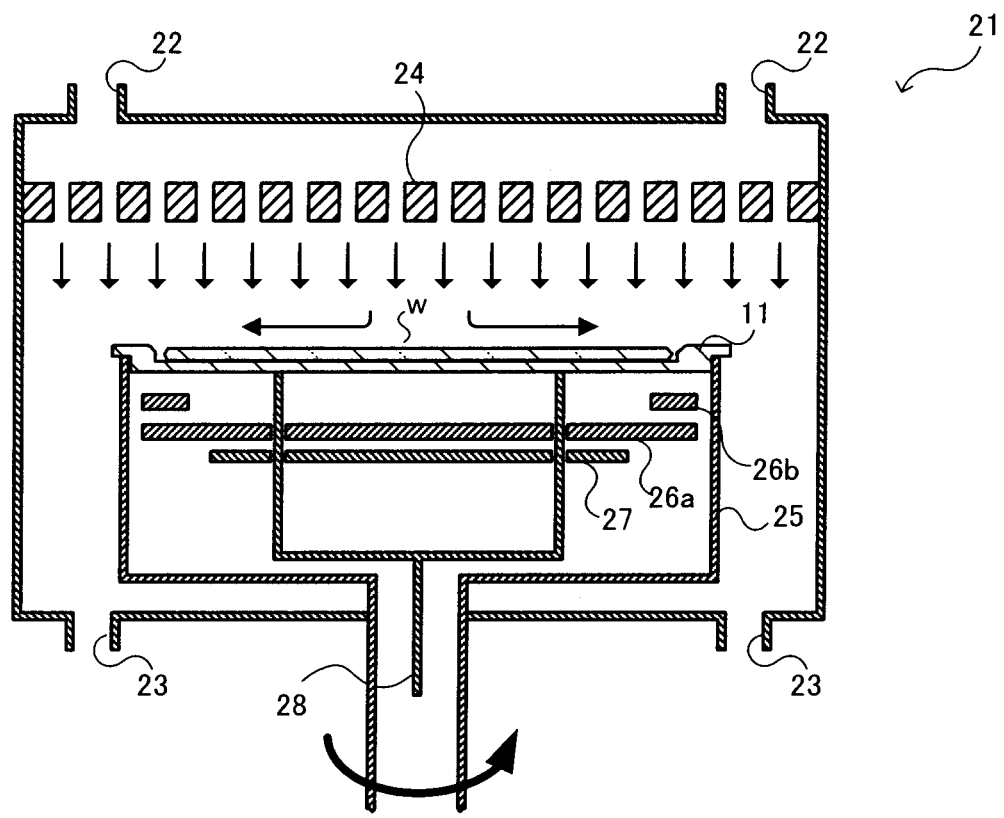
FIG. 10 is an illustrative view of an epitaxial growth apparatus using the susceptor formed according to an aspect of the present invention.

The susceptor formed in this way is used for the epitaxial growth apparatus as illustrated in FIG. 10. A reaction chamber 21, in which a wafer w of, for example, φ200 mm in diameter undergoes film formation, is provided with a gas supply port connected with a gas supply mechanism (not shown) for supplying a process gas including a source gas such as TCS and dichlorosilane onto the wafer w from above the reaction chamber 21. At a bottom portion of the reaction chamber 21, there are provided gas discharge ports 23 connected with a gas discharge mechanism (not shown) for discharging gas and controlling a pressure in the reaction chamber 21 to be constant (a normal pressure), which are provided, for example, at two positions.

At an upper portion of the reaction chamber 21, there are disposed straightening vanes 24 for supplying a process gas supplied through the gas supply opening 22 onto the wafer w in a straightened state.

At the lower portion of the reaction chamber 21, there are installed a motor (not shown), a rotating shaft (not shown), a rotation drive mechanism 25 for rotating a wafer w and including a ring 25a, and the susceptor 11 connected with the rotation drive mechanism 25 and formed as described above.

Under the susceptor 11, an in-heater 26a for heating a wafer w made of, for example, SiC is disposed. Between the susceptor 11 and the in-heater 26a, an out-heater 26b for heating a peripheral edge portion of the wafer w made of, for example, SiC is installed. Under the in-heater 26a, a disc-shaped reflector 27 for efficiently heating the wafer w is installed. There is further disposed a lifting pin 28, penetrating through the in-heater 26a and the reflector 27, for moving up and down a wafer w.

Using such a manufacturing apparatus for a semiconductor device, for example, a Si epitaxial film is formed on a wafer w. The wafer w is placed on the susceptor 11 formed with convex sections. At this time, the wafer w is held on respective tips of the convex sections.

Based on the temperature of the wafer w measured by a temperature measurement mechanism (not shown), a temperature control mechanism (not shown) appropriately controls temperatures of the in-heater 26a and the out-heater 26b within a range of, for example, 1,400 to 1,500° C. so that the temperature of the wafer w becomes, for example, 1,100° C. Further, the rotating mechanism 25 rotates the wafer w, for example, at a speed of 900 rpm.

Through the gas supply port 22, a process gas containing, for example, 20 to 100 SLM of $H_2$ as a carrier gas, 50 sccm to 2 SLM of $SiHCl_3$ as a film-forming gas, trace amount of $B_2H_6$ or $PH_3$ as a dopant gas, is introduced onto the straightening vanes 24 and supplied onto the wafer w in a straightened state. At this time, a pressure in a reaction chamber 21 is controlled to be, for example, 1,333 Pa (10 Torr) to normal pressure, by controlling valves of the gas supply ports 22 and the gas discharge ports 23. In this way, various conditions are controlled and a Si epitaxial film of, for example, 100 μm in thickness is formed on the wafer w.

In this process, a Si film is also deposited on a peripheral edge portion of the wafer w and other portions of the susceptor 11; however, the wafer w is held on the tips of the convex sections, where a contact area is small and thus stress is suppressed. Further, even when thick-film growth of tens to hundreds of micrometers is performed, portions between the convex sections are not completely filled with the deposited Si film, thus preventing the wafer w from being stuck on the susceptor.

Hence, yield and reliability can be improved in forming semiconductor devices through an element formation process and an element separation process. The present embodiment is suitable for an epitaxial formation process for power semiconductor devices such as power MOSFETs or IGBTs (insulated gate bipolar transistor), in particular for those that require thick-film growth of tens to hundreds of micrometers in an N-type base region, a P-type base region or an insulation separation region.

In the present embodiment, a carbon substrate is used as a substrate to be processed to have concave sections; however, any substrate that is easy to process can be used other than a carbon substrate, such as a Si substrate. In addition, a $SiO_2$ film is formed on a surface of a substrate to be processed by the CVD method; however, the formation method is not particularly limited and thermal oxidation may be performed when a Si substrate is used. The formation of a $SiO_2$ film is not always required and any film that allows a sufficient selective ratio of a substrate to be processed to the SiC layer. In etching under such conditions that a sufficient selective ratio (a substrate to be processed>a SiC layer) can be obtained between the substrate to be processed and the SiC layer, it is not necessary to interpose a film such as a $SiO_2$ film.

In the present embodiment, a SiC paste formed by dispersing a SiC powder, a carbon black and a boron carbide powder as a sintering agent, and a binder such as acrylic-based resin and cellulose-based resin in an organic amine-based solvent is used; however, the present invention is not limited thereto and a SiC paste (slurry) of a known composition may be used.

In the present embodiment, a carbon substrate was removed by etching after a SiC substrate had been laminated on a SiC paste and subjected to temporary firing; however, the present embodiment is not limited to this process. For example, the carbon substrate may be removed after a SiC substrate is laminated on a SiC paste and subjected to firing (sintering).

The shape of each of the convex sections on the susceptor formed according to the present embodiment is not limited to a semicircle in cross section, that is, a hemisphere. The convex sections may be of any shape that can hold a wafer placed thereon in a point-contact manner, such as a semiellipse-sphere, a shape having a hemisphere on a cylindrical column, a cone such as a circular cone.

In the present embodiment, a height of each of the convex sections is 0.5 mm; however, preferably, the height is larger than the film thickness of an epitaxial film to be formed. For example, in forming a film in a thickness of substantially 100 μm, a suitable height is 150 to 500 μm. In addition, the convex sections are formed over the whole susceptor surface at uniform intervals.

In order to suppress variations in temperature distribution caused by heat absorption or heat radiation in/from a holding portion, preferably, the convex sections are formed all over the whole susceptor surface as appropriate. The intervals may be uniform or may change depending upon locations. For example, when a temperature of a wafer outer peripheral portion is high, the convex sections may be arranged so that distribution thereof is sparse on the outer peripheral portion.

While the epitaxial film is formed on an Si substrate in this embodiment, it can be applied to forming of a polysilicon layer and it can be applied also to other compound semiconductors, for example, a GaAs layer, a GaAlAs layer, and an InGaAs layer. It can also be applied to forming of a $SiO_2$ film and a $Si_3N_4$ film, and in the case of $SiO_2$ film, monosilane ($SiH_4$) and gases of $N_2$, $O_2$, and Ar are fed, and in the case of $Si_3N_4$ film, monosilane ($SiH_4$) and gases of $NH_3$, $N_2$, $O_2$, and Ar are fed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a susceptor, comprising:
    forming a plurality of concave sections in a surface of a substrate to be processed;
    applying a SiC paste containing a SiC powder, a binder and a sintering agent onto the surface of the substrate to be processed to fill the concave sections to form a SiC coating layer;
    laminating a SiC substrate on the SiC coating layer;
    temporary firing the SiC substrate, the SiC coating layer and the substrate to be processed to carbonize the binder in the SiC coating layer;
    removing the substrate to be processed from the SiC coating layer and the SiC substrate by etching after the temporary firing; and
    firing the SiC coating layer at a temperature higher than the temperature at the temporary firing to form a SiC layer having convex sections on the surface of the SiC substrate after the removing of the substrate to be processed from the SiC coating layer and the SiC substrate.

2. The method for manufacturing a susceptor according to claim 1, wherein the substrate to be processed is a carbon substrate.

3. The method for manufacturing a susceptor according to claim 1, wherein the sintering agent contains any one of carbon black and boron carbide.

4. The method for manufacturing a susceptor according to claim 1, wherein the temporary firing is performed at 1,400 to 1,500° C. in any one of an inert gas atmosphere and a vacuum.

5. The method for manufacturing a susceptor according to claim 1, wherein the substrate to be processed has a coating with an etching rate higher than an etching rate of the substrate to be processed and SiC on the surface of the substrate to be processed.

6. The method for manufacturing a susceptor according to claim 5, wherein the coating is a $SiO_2$ film.

7. The method for manufacturing a susceptor according to claim 1, wherein the etching is performed using a HF solution.

8. The method for manufacturing a susceptor according to claim 1,
    wherein a SiC coating is applied on a surface of the SiC layer formed with the convex section.

9. The method for manufacturing a susceptor according to claim 8, wherein the SiC coating is applied by forming a CVD-SiC film.

10. The method for manufacturing a susceptor according to claim 1, wherein a height of the convex sections is 150 to 500 µm.

11. The method for manufacturing a susceptor according to claim 1, wherein a shape of the convex section is a shape that allows a wafer placed on the convex sections to be held in a point-contact manner.

12. The method for manufacturing a susceptor according to claim 1,
    wherein a shape of the convex sections includes a hemisphere, a semiellipse-sphere and a cone.

13. The method for manufacturing a susceptor according to claim 1, wherein the convex sections are formed on the whole surface of the SiC layer at uniform intervals.

14. The method for manufacturing a susceptor according to claim 1, wherein the convex sections are formed over a whole surface of the SiC layer, the convex sections are sparsely distributed in an outer-peripheral portion of the SiC layer.

* * * * *